United States Patent
Lippey (10) Patent No.: US 8,081,368 B2
(45) Date of Patent: Dec. 20, 2011

(54) SELECTIVE ABSORBING

(75) Inventor: Barret Lippey, Belmont, MA (US)

(73) Assignee: Bose Corporation, Framingham, MA (US)

(*) Notice: Subject to any disclaimer, the term of this patent is extended or adjusted under 35 U.S.C. 154(b) by 617 days.

(21) Appl. No.: 11/693,436

(22) Filed: Mar. 29, 2007

(65) Prior Publication Data

US 2008/0239497 A1 Oct. 2, 2008

(51) Int. Cl.
G02B 26/00 (2006.01)
(52) U.S. Cl. .................................................. 359/237
(58) Field of Classification Search .......... 359/237, 359/443, 449, 459, 451; 353/122
See application file for complete search history.

(56) References Cited

U.S. PATENT DOCUMENTS

| | | |
|---|---|---|
| 1,998,054 A | 4/1935 | McBurney |
| 2,590,906 A | 4/1952 | Tripp |
| 3,314,742 A | 4/1967 | Morgan |
| 3,556,640 A | 1/1971 | Austin |
| 3,712,708 A | 1/1973 | Brown |
| 3,942,869 A | 3/1976 | Portner et al. |
| RE29,091 E | 12/1976 | De Palma et al. |
| 4,190,320 A | 2/1980 | Ferro |
| 4,206,969 A | 6/1980 | Cobb |
| 4,979,803 A | 12/1990 | McGuckin et al. |
| 5,148,309 A | 9/1992 | Yamada et al. |
| 5,164,858 A | 11/1992 | Aguilera et al. |
| 5,193,015 A | 3/1993 | Shanks |
| 5,214,530 A | 5/1993 | Coombs et al. |
| 5,335,022 A | 8/1994 | Braun et al. |
| 5,361,163 A | 11/1994 | Matsuda et al. |
| 5,383,995 A | 1/1995 | Phillips et al. |
| 5,389,982 A | 2/1995 | Lee |
| 5,400,174 A | 3/1995 | Pagis et al. |
| 5,416,617 A | 5/1995 | Loiseaux |
| 5,473,469 A | 12/1995 | Magocs et al. |
| 5,486,884 A | 1/1996 | DeVaan |
| 5,521,759 A | 5/1996 | Dobrowolski et al. |
| 5,568,316 A | 10/1996 | Schrenk et al. |
| 5,625,494 A | 4/1997 | Fukushima et al. |
| 5,646,781 A | 7/1997 | Johnson, Jr. |
| 5,715,083 A | 2/1998 | Takayama |
| 5,726,805 A | 3/1998 | Kaushik et al. |
| 5,731,898 A | 3/1998 | Orzi et al. |
| 5,739,296 A | 4/1998 | Gvon et al. |
| 5,760,954 A | 6/1998 | Tatsuki et al. |
| 5,768,019 A | 6/1998 | Niwa et al. |
| 5,832,146 A | 11/1998 | Bruno |
| 5,875,012 A | 2/1999 | Crawford et al. |
| 5,880,800 A | 3/1999 | Mikura et al. |

(Continued)

FOREIGN PATENT DOCUMENTS

DE 4442045 5/1996

(Continued)

OTHER PUBLICATIONS

International Search Report, Patent Cooperation Treaty, Jun. 23, 2008.

(Continued)

*Primary Examiner* — Scott J Sugarman
*Assistant Examiner* — Tuyen Tra (57) ABSTRACT

An interference coating between a display and an intended viewing area that selectively absorbs incident optical energy in at least one first wavelength region and selectively transmits incident optical energy in at least one second wavelength region.

28 Claims, 6 Drawing Sheets

U.S. PATENT DOCUMENTS

| | | |
|---|---|---|
| 5,914,817 A | 6/1999 | Browning et al. |
| 6,018,419 A | 1/2000 | Cobb, Jr. et al. |
| 6,023,369 A | 2/2000 | Goto |
| 6,031,653 A | 2/2000 | Wang |
| 6,072,549 A | 6/2000 | Faris et al. |
| 6,157,486 A | 12/2000 | Benson et al. |
| 6,163,402 A | 12/2000 | Chou et al. |
| 6,208,463 B1 | 3/2001 | Hansen et al. |
| 6,215,592 B1 | 4/2001 | Pelekhaty |
| 6,248,448 B1 | 6/2001 | Lippey et al. |
| 6,249,378 B1 | 6/2001 | Shimamura et al. |
| 6,282,023 B1 | 8/2001 | Bergman |
| 6,284,382 B1 | 9/2001 | Ishikawa et al. |
| 6,288,172 B1 | 9/2001 | Goetz et al. |
| 6,288,842 B1 | 9/2001 | Krasa et al. |
| 6,307,675 B1 | 10/2001 | Abe et al. |
| 6,317,189 B1 | 11/2001 | Yuan et al. |
| 6,339,464 B1 | 1/2002 | Anderson et al. |
| 6,375,330 B1 | 4/2002 | Mihalakis |
| 6,381,068 B1 | 4/2002 | Harada et al. |
| 6,392,766 B1 | 5/2002 | Gnaedig et al. |
| 6,414,727 B1 | 7/2002 | Benton |
| 6,421,174 B1 | 7/2002 | Ooshima et al. |
| 6,428,169 B1 | 8/2002 | Deter et al. |
| 6,449,089 B1 | 9/2002 | Moshrefzadeh et al. |
| 6,525,877 B1 | 2/2003 | Clabburn et al. |
| 6,529,322 B1 | 3/2003 | Jones et al. |
| 6,530,667 B1 | 3/2003 | Idaszak et al. |
| 6,561,654 B2 | 5/2003 | Mukawa et al. |
| 6,590,710 B2 | 7/2003 | Hara et al. |
| 6,618,199 B2 | 9/2003 | Cook |
| 6,643,069 B2 * | 11/2003 | Dewald .................. 359/629 |
| 6,650,455 B2 | 11/2003 | Miles |
| 6,674,562 B1 | 1/2004 | Miles |
| 6,680,792 B2 | 1/2004 | Miles |
| 6,784,608 B2 * | 8/2004 | Araki et al. ............... 313/479 |
| 6,831,784 B2 | 12/2004 | Takeda et al. |
| 6,847,483 B2 * | 1/2005 | Lippey et al. ............. 359/443 |
| 6,850,365 B2 * | 2/2005 | Ishikawa .................. 359/586 |
| 6,872,497 B1 * | 3/2005 | Levinson et al. ............. 430/5 |
| 6,894,835 B2 | 5/2005 | Ohsako et al. |
| 7,035,015 B2 | 4/2006 | Teijido |
| 7,040,764 B2 * | 5/2006 | Przybyla et al. ............. 353/84 |
| 7,054,063 B2 * | 5/2006 | Shimoda .................. 359/459 |
| 7,071,907 B1 * | 7/2006 | Duboc et al. ............... 345/87 |
| 7,090,357 B2 | 8/2006 | Magarill et al. |
| 7,161,737 B2 * | 1/2007 | Umeya .................... 359/454 |
| 7,423,809 B2 * | 9/2008 | Oshima et al. ............. 359/459 |
| 7,435,964 B2 * | 10/2008 | Lane et al. ................ 250/346 |
| 7,570,423 B2 * | 8/2009 | Willard ................... 359/459 |
| 7,724,434 B2 * | 5/2010 | Cross et al. ............... 359/498 |
| 2001/0011779 A1 | 8/2001 | Stover |
| 2002/0015215 A1 | 2/2002 | Miles |
| 2002/0024711 A1 | 2/2002 | Miles |
| 2002/0063350 A1 | 5/2002 | Matsumoto |
| 2002/0075555 A1 | 6/2002 | Miles |
| 2002/0126364 A1 | 9/2002 | Miles |
| 2002/0130994 A1 | 9/2002 | Karman |
| 2003/0043157 A1 | 3/2003 | Miles |
| 2003/0043346 A1 | 3/2003 | Kwok et al. |
| 2003/0128430 A1 | 7/2003 | Leu et al. |
| 2003/0156238 A1 | 8/2003 | Hiraishi et al. |
| 2003/0156326 A1 | 8/2003 | Lotz et al. |
| 2003/0156328 A1 | 8/2003 | Goto et al. |
| 2003/0214632 A1 | 11/2003 | Ma et al. |
| 2003/0227585 A1 * | 12/2003 | Chang et al. ............... 349/74 |
| 2004/0061935 A1 | 4/2004 | Obsako |
| 2004/0196551 A1 | 10/2004 | Chubachi et al. |
| 2004/0233524 A1 | 11/2004 | Lippey |
| 2004/0240053 A1 | 12/2004 | Shimoda |
| 2005/0030480 A1 | 2/2005 | Lippey |
| 2005/0105176 A1 | 5/2005 | Lippey |
| 2005/0207002 A1 | 9/2005 | Liu et al. |
| 2005/0231800 A1 | 10/2005 | Lippey |
| 2005/0241530 A1 | 11/2005 | Bruckner et al. |

FOREIGN PATENT DOCUMENTS

| | | |
|---|---|---|
| DE | 197 47 597 | 8/1998 |
| DE | 19901970 | 8/2000 |
| EP | 0 442 738 A2 | 2/1991 |
| EP | 0 493 863 | 7/1992 |
| EP | 0 648 048 B1 | 10/1994 |
| EP | 0 609 593 B1 | 2/1995 |
| EP | 0833172 | 4/1998 |
| EP | 0 856 768 A | 5/1998 |
| EP | 0 657 769 B1 | 3/2000 |
| EP | 1 324 114 | 7/2003 |
| EP | 1324114 | 7/2003 |
| GB | 511 199 | 8/1939 |
| GB | 652 859 | 5/1951 |
| GB | 2161983 | 1/1986 |
| JP | 56047012 | 4/1981 |
| JP | 62178906 | 8/1987 |
| JP | 05011344 A | 1/1993 |
| JP | 05216123 A | 8/1993 |
| JP | 06148409 | 5/1994 |
| JP | HEI 6-289491 | 10/1994 |
| JP | 07 270 915 | 2/1996 |
| JP | 08186849 | 11/1996 |
| JP | H11-119002 | 8/1999 |
| JP | 2001-005412 | 1/2001 |
| JP | 2000-284908 | 2/2001 |
| JP | 2001 055646 | 6/2001 |
| JP | 2003-50306 A | 2/2003 |
| JP | 2003-121637 A | 4/2003 |
| JP | 2003-337381 A | 11/2003 |
| JP | 2004-029163 A | 1/2004 |
| JP | 2004/038003 | 2/2004 |
| JP | 2004/61545 | 2/2004 |
| JP | 2004-101558 A | 4/2004 |
| JP | 2004-117480 A | 4/2004 |
| JP | 2004-138938 | 5/2004 |
| JP | 2004-144882 | 5/2004 |
| JP | 2004-144883 | 5/2004 |
| JP | 2004163806 | 6/2004 |
| JP | 2004170959 | 6/2004 |
| WO | WO 95/17690 | 6/1995 |
| WO | 9632663 | 10/1996 |
| WO | WO 98/36320 | 8/1998 |
| WO | WO 00/41009 | 7/2000 |
| WO | WO 00/45220 | 8/2000 |
| WO | WO 00/57214 | 9/2000 |
| WO | WO 03/050612 A1 | 6/2003 |
| WO | WO 03/077027 A1 | 9/2003 |
| WO | WO 03/077028 A1 | 9/2003 |
| WO | WO 2004/031852 A1 | 4/2004 |

OTHER PUBLICATIONS

Shimoda, K., "Multi-Layer Dichroic Coating on Plastic Webs," *Proceedings of Thirteenth International Conference on Vacuum Web Coating*, R. Bakish, Ed., pp. 58-67, Tucson, AZ, Oct. 17-19, 1999.

Lotz, H. et al., "Thick Optical Multi-Layer Systems on PET Film," Precision, Nov. 2001, as printed from http://www.appliedfilms.com/Precision3/14_multilayer_systems/multilayer_systems_print.htm.

Pelletier et al., "Interference filters with multiple peaks,"J. Opt. Soc. Am., vol. 72(6), pp. 683-387 (Jun. 1982).

International Preliminary Report on Patentability dated Oct. 8, 2009 for PCT/US2008/058644.

* cited by examiner

| Layer | Material | Thickness (nm) |
|---|---|---|
| (side towards display) | | |
| 1 | $SiO_2$ | 123 |
| 2 | $TiO_2$ | 25 |
| 3 | $SiO_2$ | 188 |
| 4 | $TiO_2$ | 136 |
| 5 | $SiO_2$ | 25 |
| 6 | $TiO_2$ | 144 |
| 7 | $SiO_2$ | 175 |
| 8 | $TiO_2$ | 120 |
| 9 | $SiO_2$ | 104 |
| 10 | $TiO_2$ | 83 |
| 11 | $SiO_2$ | 96 |
| 12 | $TiO_2$ | 101 |
| 13 | $SiO_2$ | 126 |
| 14 | $TiO_2$ | 99 |
| 15 | $SiO_2$ | 217 |
| 16 | $TiO_2$ | 26 |
| 17 | $SiO_2$ | 42 |
| 18 | $TiO_2$ | 100 |
| 19 | $SiO_2$ | 50 |
| 20 | $TiO_2$ | 7 |
| 21 | $SiO_2$ | 42 |
| 22 | Ti | 6 |
| 23 | $SiO_2$ | 44 |
| 24 | $TiO_2$ | 9 |
| (side towards viewer) | | |

SELECTIVE ABSORBING

TECHNICAL FIELD

The present invention relates in general to selective absorbing of light and more particularly concerns selective absorbing of light for rear-illuminated display systems, such as used in television or home cinema applications.

BACKGROUND

For background, reference is made to U.S. Pat. No. 6,847,483.

SUMMARY

In general, in one aspect, an optical device includes a rear-illuminated display and an interference coating between the display and an intended viewing area that selectively absorbs incident optical energy in at least one first wavelength region and selectively transmits incident optical energy in at least one second wavelength region.

Implementations may include one or more of the following features. The first wavelength region may correspond to yellow light or cyan light. The second wavelength region may correspond to green light. The first wavelength region may have an average absorption of greater than 50%. The second wavelength region may have an average absorption less than 30%. The second wavelength region may have an average transmission of greater than 60% and the first wavelength region may optionally have an average transmission less than 40%. The average reflection may be less than 5% in the wavelength region between 540 and 560 nm and less than 10% in the wavelength region between 500 and 600 nm. The interference coating may further include an absorptive layer and may optionally include selective absorption in the absorptive layer. The absorptive layer may include a metal compound. The absorptive layer may include a Titanium nitride, Silicon nitride, or Zirconium nitride. The absorptive layer may include a metal. The absorptive layer may include Titanium, Niobium, Zirconium, Chromium, or Silicon. The rear-illuminated display may include a DMD light modulator, a transmissive-LCD light modulator, or an LCOS light modulator. The rear-illuminated display may include a UHP projection lamp or an LED projection lamp. The interference coating may be deposited on a substrate.

In general, in one aspect, an interference coating for use with a display that selectively absorbs incident optical energy in a predetermined number of first wavelength regions and selectively transmits incident optical energy in a predetermined number of second wavelength regions.

Implementations may include one or more of the following features. The interference coating comprises an absorptive layer. Selective absorption may occur in the absorptive layer.

In general, in one aspect, an optical device includes a rear-illuminated display with red, green, and blue emission regions and an interference coating between the display and an intended viewing area that selectively transmits in the wavelength regions that correspond to the red, green, and blue emission regions. The interference coating selectively absorbs in at least one other wavelength region.

Implementations may include one or more of the following features. The other wavelength region may correspond to at least yellow light or cyan light.

In general, in one aspect, an optical device includes a rear-illuminated display and an interference coating between the display and an intended viewing area that selectively absorbs incident optical energy in a plurality of absorption regions and selectively transmits incident optical energy in a plurality of transmission regions. The transmission regions are distinct from the absorption regions.

Implementations may include one or more of the following features. The absorption regions may correspond to yellow and cyan light. The transmission regions may correspond to blue, green, and red light.

In general, in one aspect, a method for increasing contrast ratio includes selectively absorbing ambient light in an interference coating placed between a rear-illuminated display and an intended viewing area, and transmitting light from the display through the interference coating to the intended viewing area.

DETAILED DESCRIPTION

The cross-sectional views of the drawing are not drawn to scale. Some actual dimensions are as stated in the specification and figures.

Displays can be divided two general categories, front illuminated and rear illuminated, for use in, e.g., home cinema and business applications. Light modulators turn on and turn off pixels of pre-selected color spectral bands of visible light (e.g., red light, blue light, and green light) to form images on surfaces, e.g., display screens. Generally, front illuminated displays, such as front projectors, have a light source on the same side of the screen as the viewer and illuminate a reflective display screen that reflects light into the viewer's eyes. Rear illuminated displays, such as rear-projection televisions and liquid-crystal flat-panel displays, have a light source on the opposite side of the screen from the viewer and illuminate a transmissive display screen to display an image that is viewed from the side of the screen that is opposite the light source. Rear-illuminated displays include flat-panel liquid crystal displays (LCD), flat-panel plasma displays, organic light emitting diode (OLED) displays, cathode ray tube (CRT) displays, and rear-projection displays that use light modulator technology such as digital micromirror devices (DMDs), transmissive LCD devices, or liquid crystal on silicon (LCOS) devices.

The display produces monochromatic or color images by decoding received electronic signals and using the signals to independently vary the brightness of each pixel on the display as a function of time. Pixels may be fixed with specific colors or the colors of pixels may be changed depending on the type of display device. For color displays, the pixel colors are typically blue, green, and red. Blue pixels typically correspond to a wavelength region of approximately 450 to 480 nm. Green pixels typically correspond to a wavelength region of approximately 520 to 560 nm. Red pixels typically correspond to a wavelength region of approximately 600 to 640 nm. Ambient light is generally white and can be broken down into blue, cyan, green, yellow, and red wavelength regions. Cyan typically corresponds to a wavelength region of approximately 480 to 520 nm. Yellow typically corresponds to a wavelength region of approximately 560 to 600 nm.

Figure 1:
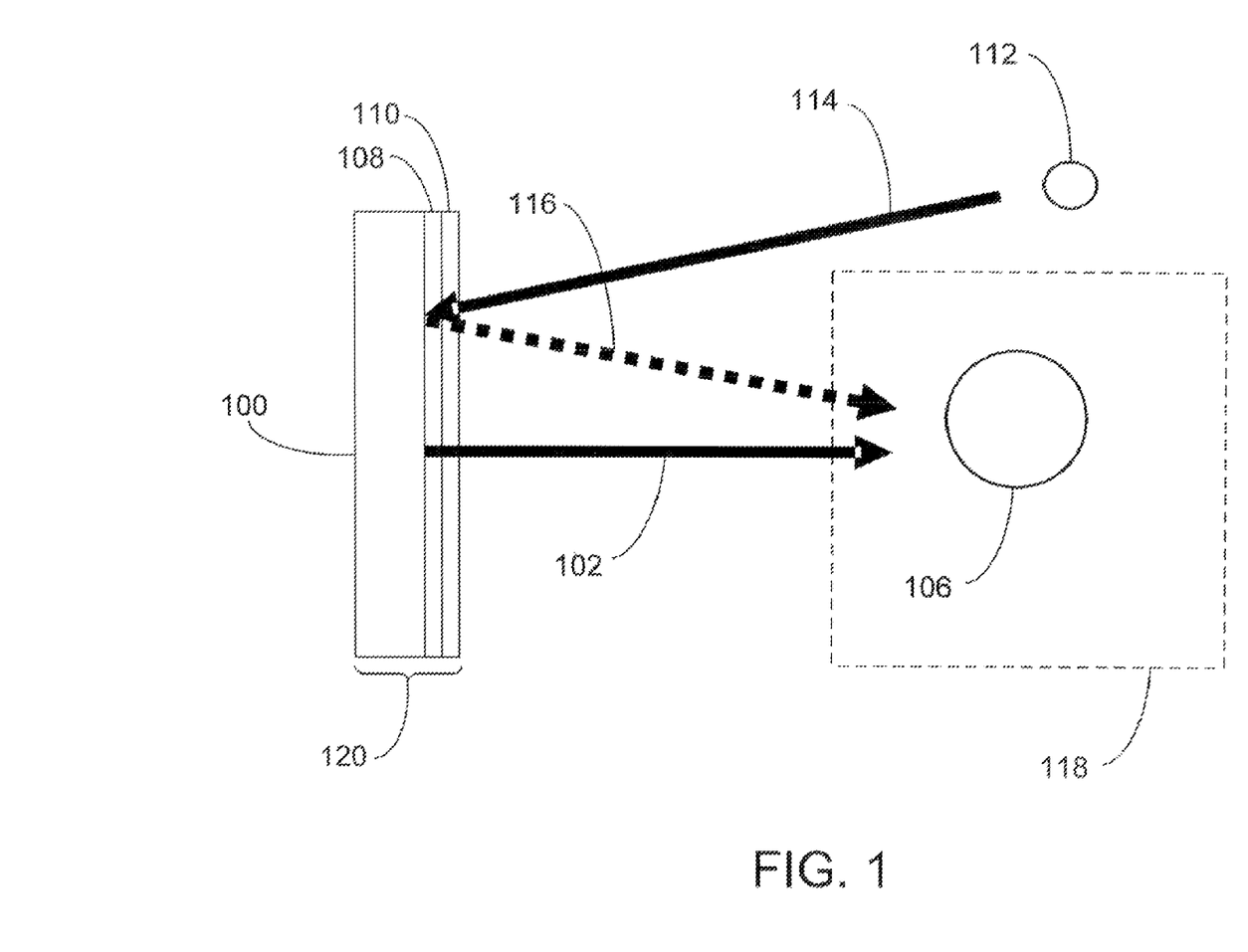
FIG. 1 is a schematic drawing of a rear-illuminated display with a selective absorbing coating.

Referring to FIG. 1, there is shown a schematic drawing of the components of a selective absorbing coating with a video display. A rear-illuminated video display 100 such as an LCD panel generates display light 102, which consists of narrow bands of blue, green, and red light. Display light 102 passes through a coating substrate 108, an interference coating 110, and is then perceived visually by a viewer 106 located in an intended viewing area 118. Display assembly 120 includes display 100, substrate 108, and interference coating 110. FIG. 1 shows coating 110 on the viewer side of substrate 108. Alternatively, coating 110 may be located on the side of substrate 108 that is opposite the viewer. Coating 110 may optionally be deposited directly on display 100, in which case there is no substrate 108. Ambient light 114 from sources such as room lighting and sunlight, represented by light source 112, consists of blue, cyan, green, yellow, and red light. Ambient light 114 passes through interference coating 110, and reflects off the display as reflected ambient light 116. Reflected ambient light 116 passes again through interference coating 110 and is then visually perceived by viewer 106 located in intended viewing area 118. The blue, green, and red wavelength regions of display light 102 and incident ambient light 114 selectively pass through coating 110. The cyan and yellow wavelength regions of incident ambient light 114 are selectively absorbed in coating 110 so that the intensity of these wavelength regions is reduced in reflected ambient light 116 compared to the light reflected in the blue, green and red bands. The reduced intensity of reflected ambient light 116 is indicated by a dotted line in FIG. 1.

The contrast ratio of display assembly 120 in the presence of substantial ambient light is defined as the visible intensity of the display light 102 divided by the visible intensity of the reflected ambient light 116. The contrast ratio is beneficially increased by the coating 110 because the visible intensity of the reflected ambient light is preferentially reduced by the selective absorption of coating 110.

The desired characteristics for a display assembly with a selective absorbing coating include high transmittance of the selective absorbing coating in the wavelength regions that are used for information display (e.g. blue, green, and red) and high absorbance for the wavelength regions that are present in the ambient light but not used for information display (e.g. cyan and yellow). It is also beneficial for the display assembly to have low reflectance of ambient light so that glare is minimized.

In some implementations, interference coating 110 is constructed from a multilayer interference coating which is an optical filter that can transmit, reflect, or absorb light depending on the wavelength. Multilayer interference coatings are constructed by depositing adjacent layers of different materials, wherein each layer of material has a different index-of-refraction (n) than the material of the adjacent layer or layers. Multilayer interference coatings operate by using constructive and destructive interference between incident light and light that reflects at various layer interferences. It is usually advantageous to maximize the difference in n between adjacent layers, so it is typical to use alternating layers of high n materials (such as $TiO_2$, $Nb_2O_5$, or $Ta_2O_5$) and low n materials (such as $SiO_2$) in adjacent layers. However, it is also possible to use materials with medium n (such as $Al_2O_3$), or to use two materials having a high n (or two materials having a low n) in adjacent layers. Further information on multilayer interference coatings can be found in *Thin Film Optical Filters* by H. A. MacLeod, ISBN 0750306882.

An interference coating can be mathematically calculated and designed with commercially available computer software such as TFCalc available from Software Spectra Inc. at Internet address www.tfcalc.com. The coating is designed to achieve the desired transmission, reflection, and absorption targets by selecting the layer thicknesses and materials such that ambient light is selectively absorbed in certain wavelength regions e.g. cyan and yellow while light from the display is selectively transmitted in certain wavelength regions, e.g. red, green, and blue. Reflection is generally undesirable for rear-illuminated displays and is minimized by setting low reflection targets during the design process.

Figure 2:
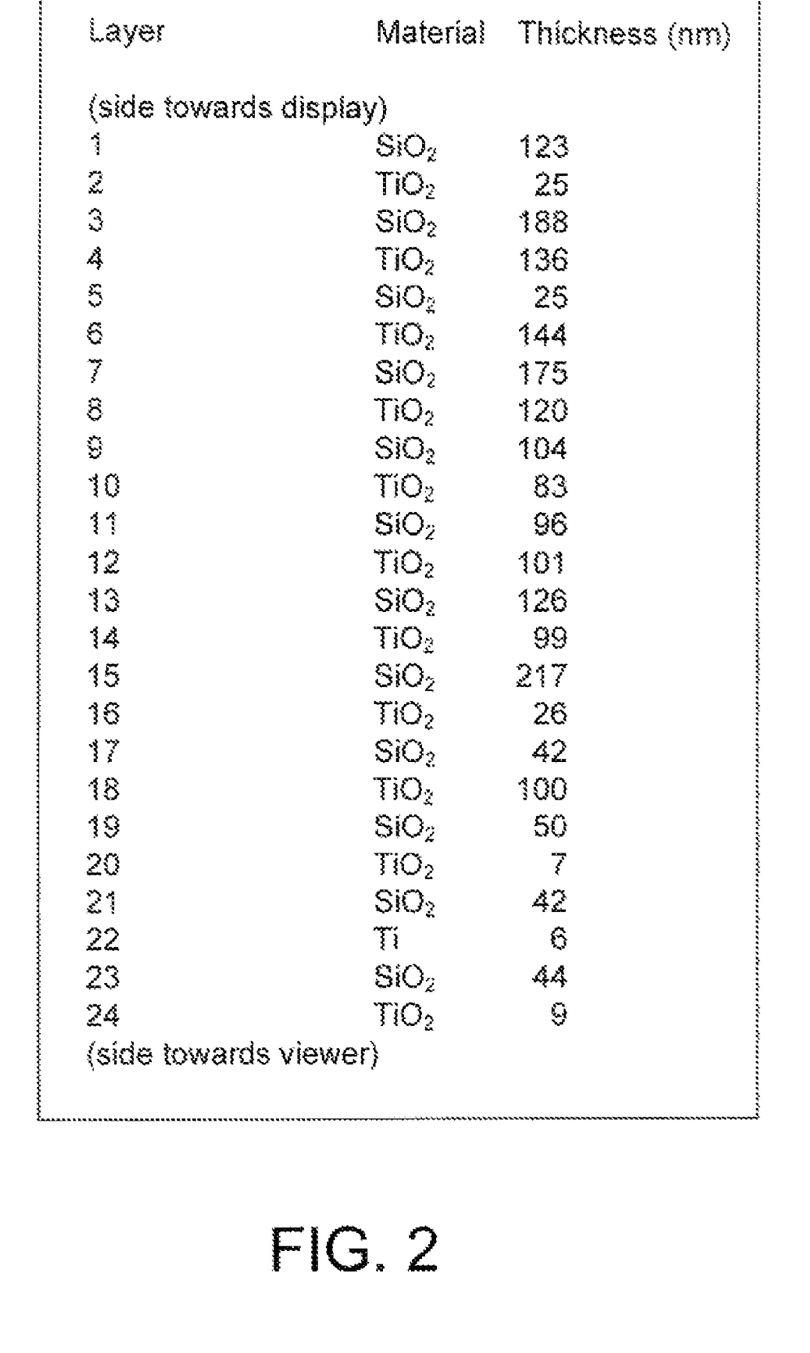
FIG. 2 is a table of an interference-coating optical design.

Referring to FIG. 2, there is shown a table of an optical design for one implementation of interference coating 110. The optical design includes alternating layers of $TiO_2$ and $SiO_2$ in adjacent layers. The thickness of each layer is shown in nanometers. Layer 22 is an optically absorptive layer of Titanium metal. The thickness of each layer of the multilayer interference coating in FIG. 2 is designed to maximize selective absorption of the cyan and yellow wavelength regions. The absorption takes place in the absorptive material of layer 22.

The absorptive material used in interference coating 110 may be an environmentally durable metal such as Titanium, Niobium, Zirconium, Chromium, or Silicon or it may be an environmentally durable compound such as Titanium nitride, Silicon nitride, or Zirconium nitride. Although some of these materials are conventionally considered to be reflective materials, they may also exhibit high absorption when combined together with other layers in an interference coating.

Interference coating 110 may be manufactured by sputtering, physical vapor deposition, or other optical coating processes. The coating process may be a batch process or a roll-coating process. Substrate 108 may be a rigid substrate such as glass or plastic sheet or it may be a flexible material such as plastic film. Coating 110 may also be deposited directly on the front surface of display 100 or within display 100. The dimensions of coating 110 will usually match the dimensions of the display or be slightly smaller if a bezel covers the edge of the display. The diagonal size of the display may be as small as 2 to 10 cm for portable devices or as large as 2.5 m or larger for wall-mounted video displays.

Figure 3:
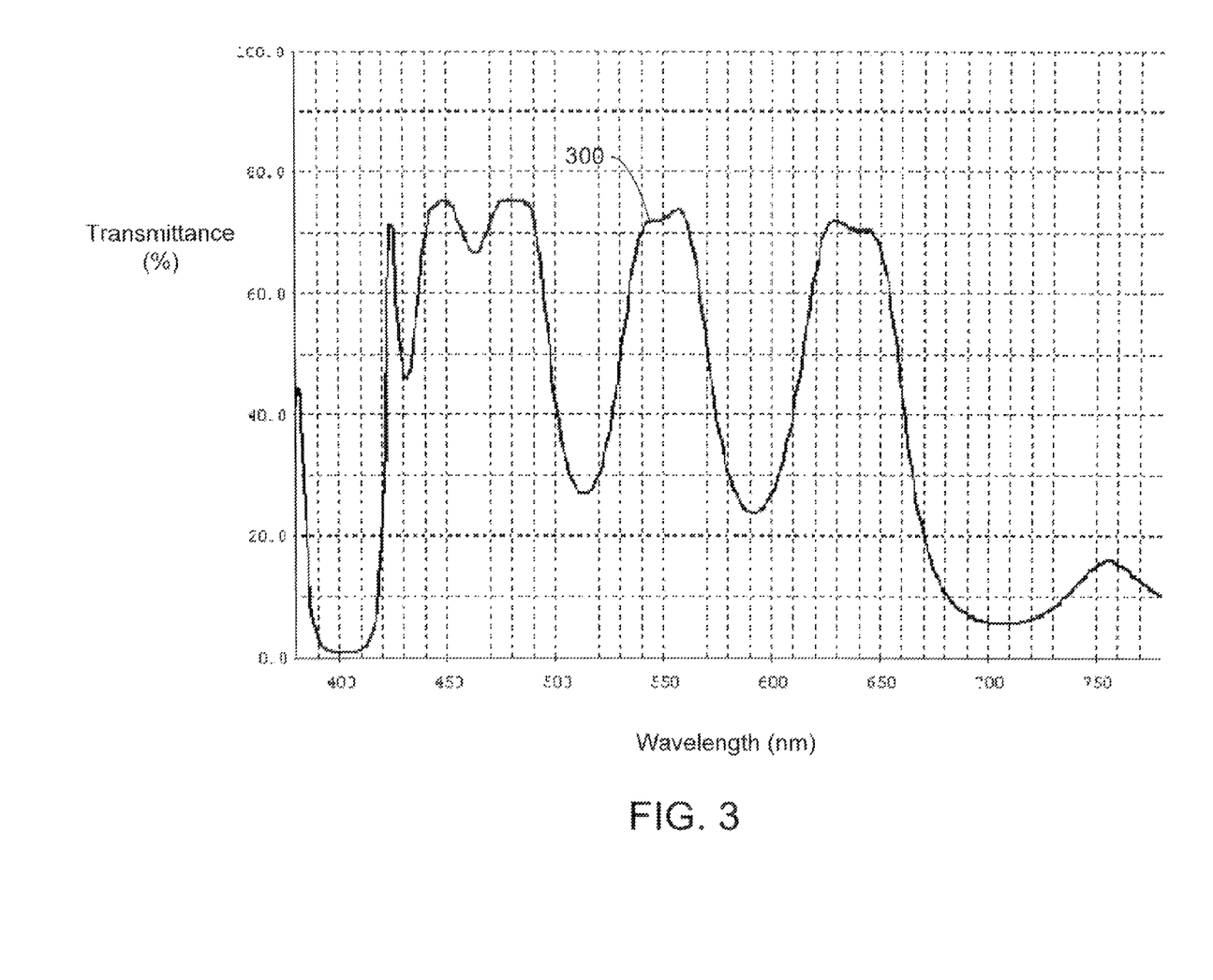
FIG. 3 is a graph of an interference-coating transmission.

Referring to FIG. 3, curve 300 shows a graphical representation of the transmittance of the coating design described in FIG. 2. The vertical axis represents the transmittance of the interference coating of FIG. 2 and the horizontal axis represents the wavelength of the light transmitted through the coating. In this implementation, the blue wavelength region is 450 to 490 nm, the green wavelength region is 540 to 560 nm, and the red wavelength region is 620 to 650 nm. The average of an optical property such as transmittance can be calculated for a wavelength region of the coating. The average within the region is defined by adding the transmittance values within the region and dividing by the number of values. The average transmittance in each of the blue, green, and red wavelength regions is approximately 70% for the implementation of FIG. 2. The average transmittance should be higher than approximately 60% to allow visible light to transmit through the coating to the viewer. The transition region occurs between the wavelength that corresponds to 90% of the maximum value of the transmission region and the wavelength that corresponds to 110% of the minimum value of the blocking region adjacent to the transmission region. In general, a small transition region is desirable to help maximize the transmission of the coating design.

Figure 4:
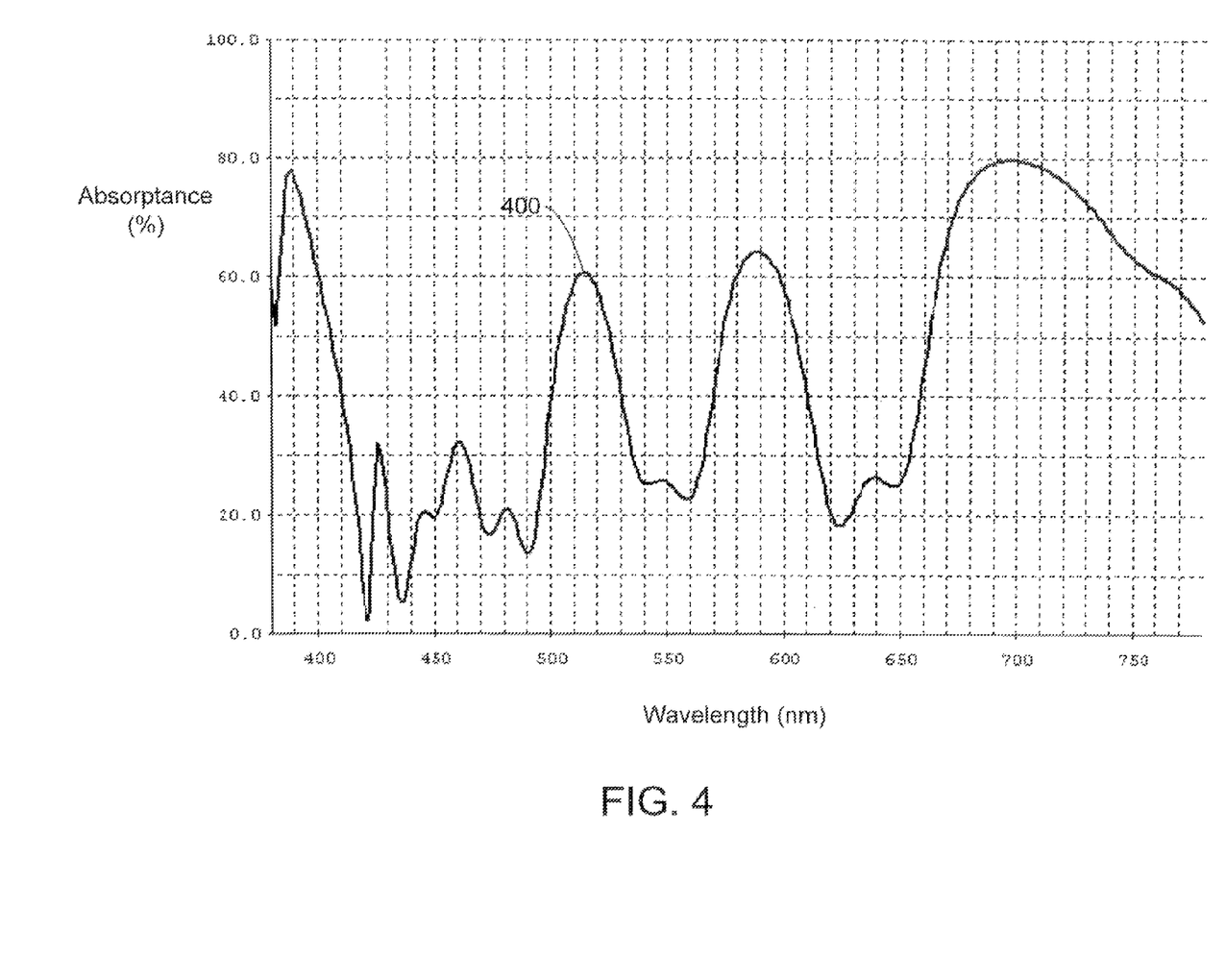
FIG. 4 is a graph of an interference-coating absorption.

Referring to FIG. 4, curve 400 shows a graphical representation of the absorbance of the coating design described in FIG. 2. For an optical coating that has a small amount of scattered light, the absorbance (in percent) is defined as 100 minus transmittance minus reflectance. In this implementation, the cyan wavelength region is 505 to 525 nm and the yellow wavelength region is 575 to 605 nm. The average absorbance in each of the cyan and yellow wavelength regions is approximately 55 to 60%. The average absorbance should be higher than approximately 50% to absorb the cyan and yellow bands of light and thus raise the contrast ratio. The transition region is defined for absorption similar to the definition for transmission.

Figure 5:
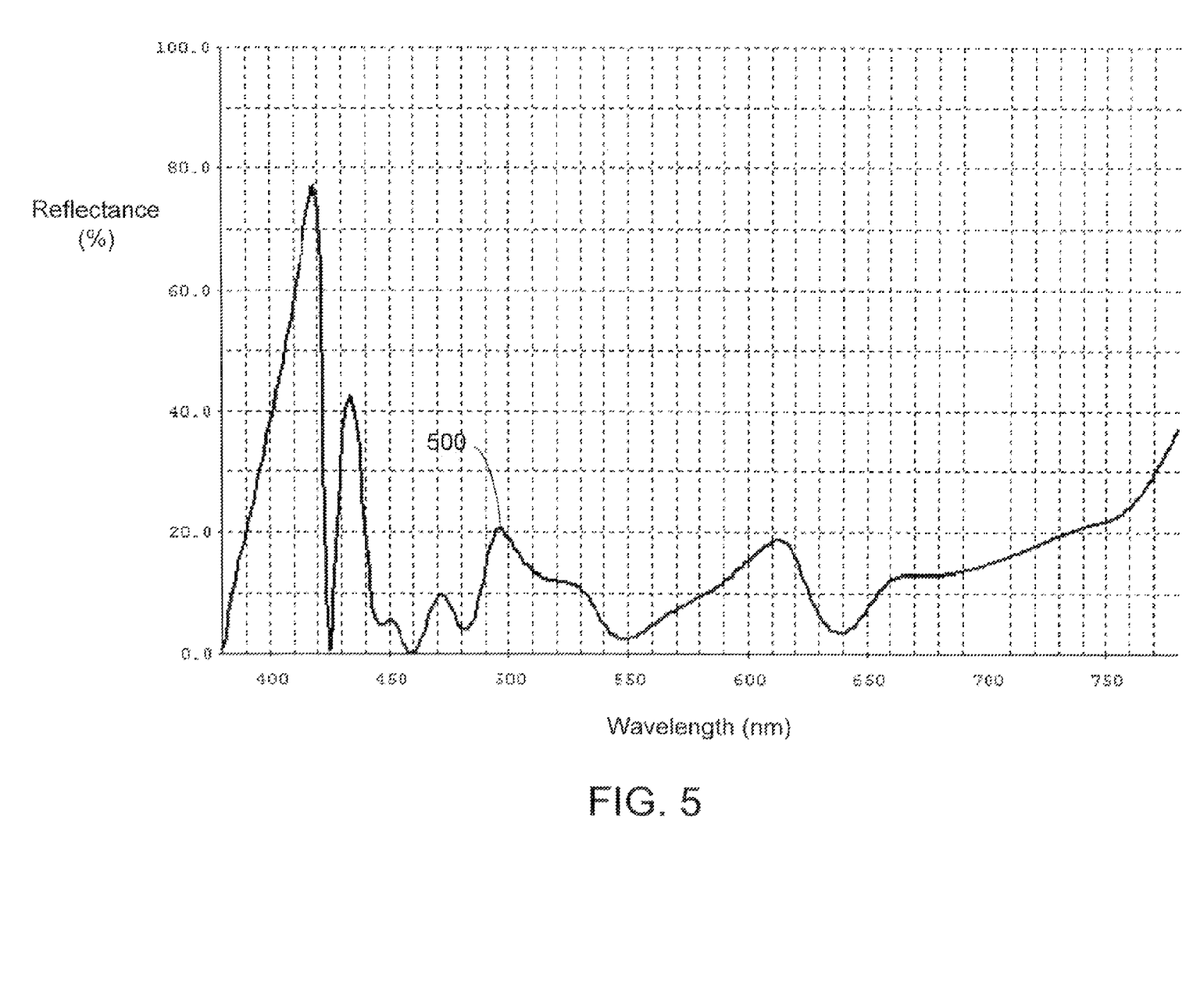
FIG. 5 is a graph of an interference-coating reflection.

The reflectance of ambient light by the selective absorbing coating should be small to reduce glare and visible reflections of the surrounding environment at the surface of the display assembly. The reflectance of the display light by the selective absorbing coating should also be small to avoid ghosting issues from light that is reflected back into the display and then reflected back out to the viewer. Referring to FIG. 5, curve 500 shows a graphical representation of the reflectance of the coating design described in FIG. 2. The average reflectance is less than 5% in the green wavelength region between 540 and 560 nm and less than 10% in the wavelength region between 500 and 600 nm, which includes the colors of green, yellow, and orange. The wavelength region between 540 and 560 is at the peak of the optical sensitivity of the human eye, so minimum reflectance is desirable in that wavelength region. The wavelength region between 500 and 600 nm covers most of the wavelength region that the human eye can perceive with high sensitivity so it is also desirable to minimize the reflection in this wavelength region. The wavelength regions outside of 500 to 600 nm do not contribute substantially to visible reflection, so the allowable reflection from the coating can be higher than within the 500 to 600 nm region.

The interference coating of FIG. 2 may be incorporated internally to the display device rather than on the front surface. The details of incorporation will depend on the type of display device. For example, with an LCD flat panel display, the interference coating 110 may be deposited on an interior glass or plastic surface rather than on the front surface. The interference coating 110 may be adhesively bonded such that the coating is immersed in materials with an index-of-refraction of approximately 1.5 such as conventional glass or plastic materials that are usually used for optical purposes. The adhesive may be a pressure-sensitive adhesive, ultraviolet-cure adhesive, or any optically transparent adhesive. The index-of-refraction of the adhesive is generally chosen to match the other optical materials so that there is minimal reflection between the adhesive and the other optical materials. The index-of-refraction of the adhesive may be approximately 1.5. The transmittance of FIG. 3, absorbance of FIG. 4, and reflectance of FIG. 5 is calculated for a coating that is immersed in materials and adhesives that have an index-of-refraction of 1.5.

Figure 6:
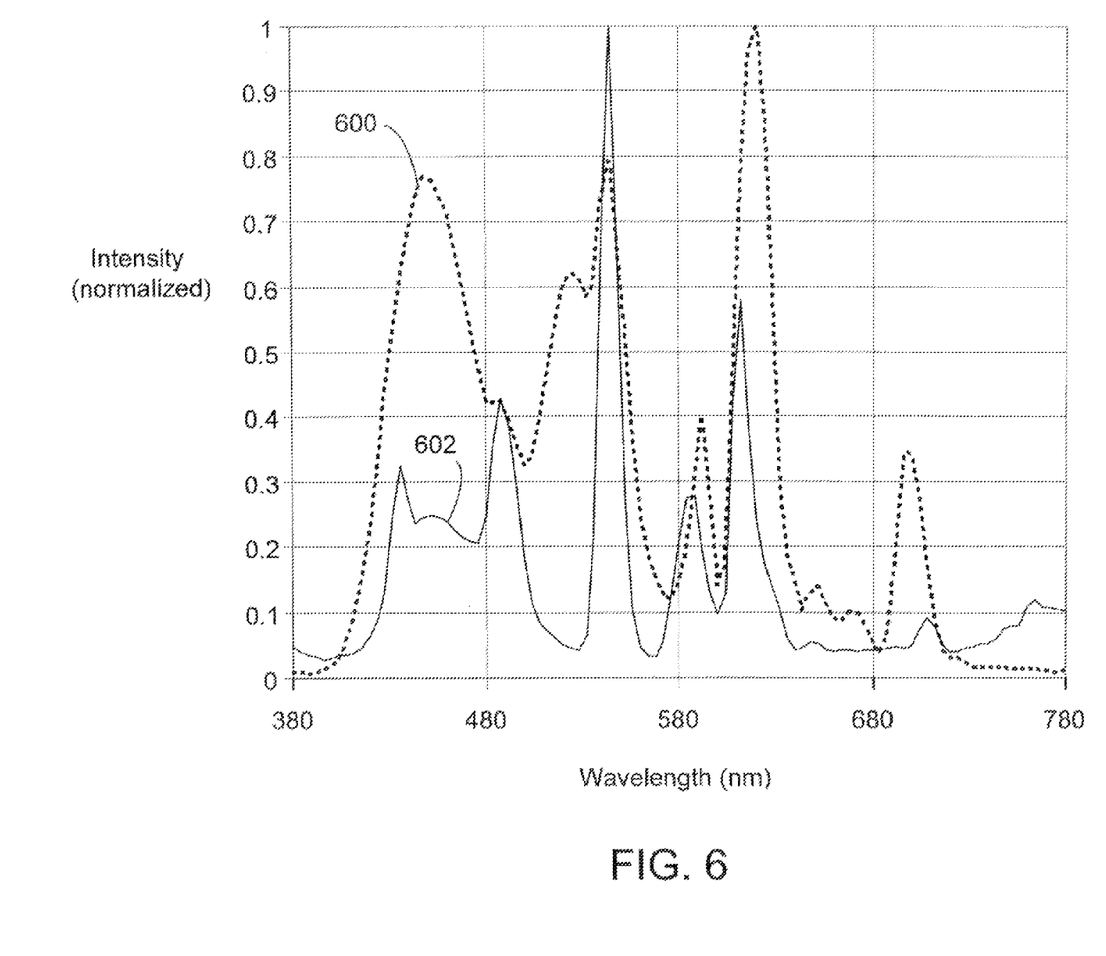
FIG. 6 is a graph of plasma and LCD display spectrums.

Referring to FIG. 6, curve 600 shows a graphical representation of a typical plasma-display optical spectrum and curve 602 shows a typical LCD-display optical spectrum. The optical spectrum shows the normalized intensity as a function of wavelength. The coating design described in FIG. 2 has its transmissive regions matched to the blue, green, and red wavelength bands of the plasma and LCD displays shown in FIG. 6. The selective absorbing coating may be used with various rear-illuminated displays such as flat-panel liquid crystal displays (LCD), flat-panel plasma displays, organic light emitting diode (OLED) displays, cathode ray tube (CRT) displays, and rear-projection displays that use light modulator technology such as digital micromirror devices (DMDs), transmissive LCD devices, or liquid crystal on silicon (LCOS) devices. The rear-projection displays may use projection lamps based on various sources such as ultra-high-performance (UHP) lamps, xenon lamps, light emitting diodes (LEDs), or lasers. The color pixels in the displays may be produced by various technologies such as fixed color filters, color wheels, sequentially-timed light sources, or separate red, green, and blue light sources. By varying the layer thicknesses and materials, the transmission regions of the coating may be adjusted to match the emission wavelengths of the display. The absorption regions of the selective absorbing coating may be designed to match the regions between the emission regions of the display. The spectrum of a display device may be different depending on the backlight source. For example, LCD displays may have fluorescent backlights or may have LED backlights. Other display technologies may be used such as surface-conduction electron-emitter displays (SEDs), organic LEDs (OLEDs) or other rear-illuminated displays not specifically mentioned here.

Conventional methods of increasing display contrast utilize colored materials such as intrinsically colored glass or plastic. Interference coatings are advantageous because interference coatings can be mathematically and predictably designed to absorb in arbitrary wavelength regions and to have arbitrarily small transition regions in the spectral curves whereas intrinsically colored materials have their wavelength regions and the size of their transition regions limited by the chemistry of the colored materials.

In some implementations, a monochromatic display, or black and white display may be used. The selective absorbing filter may than be designed so that it matches the single band of light from the display rather than the multiple bands of light that are used in a color display.

It is evident that those skilled in the art may now make numerous uses and modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. An optical device comprising:
  a rear-illuminated display; and
  an interference coating between the rear-illuminated display and an intended viewing area that selectively absorbs an incident optical energy in at least one first wavelength region of the visible spectrum and selectively transmits at least 50% of the incident optical energy in at least one second wavelength region of the visible spectrum.

2. An optical device in accordance with claim 1, wherein the first wavelength region corresponds to yellow light.

3. An optical device in accordance with claim 1, wherein the first wavelength region corresponds to cyan light.

4. An optical device in accordance with claim 1, wherein the second wavelength region corresponds to green light.

5. An optical device in accordance with claim 1, wherein the first wavelength region has an average absorption of greater than 50%.

6. An optical device in accordance with claim 5, wherein the second wavelength region has an average absorption less than 30%.

7. An optical device in accordance with claim 1, wherein the second wavelength region has an average transmission of greater than 60%.

8. An optical device in accordance with claim 7, wherein the first wavelength region has an average transmission less than 40%.

9. An optical device in accordance with claim 1, wherein the average reflection is less than 5% in the wavelength region between 540 and 560 nm and less than 10% in the wavelength region between 500 and 600 nm.

10. An optical device in accordance with claim 1, wherein the interference coating comprises an absorptive layer.

11. An optical device in accordance with claim 10, wherein selective absorption occurs in the absorptive layer.

12. An optical device in accordance with claim 10, wherein the absorptive layer comprises a metal compound.

13. An optical device in accordance with claim 12, wherein the absorptive layer comprises a material chosen from the group consisting of Titanium nitride, Silicon nitride, and Zirconium nitride.

14. An optical device in accordance with claim 10, wherein the absorptive layer comprises a metal.

15. An optical device in accordance with claim 14, wherein the absorptive layer comprises a material chosen from the group consisting of Titanium, Niobium, Zirconium, Chromium, and Silicon.

16. An optical device in accordance with claim 1, wherein the rear-illuminated display comprises a DMD light modulator.

17. An optical device in accordance with claim 1, wherein the rear-illuminated display comprises a transmissive-LCD light modulator.

18. An optical device in accordance with claim 1, wherein the rear-illuminated display comprises an LCOS light modulator.

19. An optical device in accordance with claim 1, wherein the rear-illuminated display comprises a UHP projection lamp.

20. An optical device in accordance with claim 1, wherein the rear-illuminated display comprises an LED projection lamp.

21. An optical system in accordance with claim 1 wherein the interference coating is deposited on a substrate.

22. An interference coating for use with a display that selectively absorbs incident optical energy in a predetermined number of first wavelength regions in the visible spectrum and selectively transmits at least 50% of the incident optical energy in a predetermined number of second wavelength regions in the visible spectrum.

23. An interference coating in accordance with claim 22, wherein the interference coating comprises an absorptive layer.

24. An interference coating in accordance with claim 23, wherein selective absorption occurs in the absorptive layer.

25. An optical device comprising:
a rear-illuminated display; and
an interference coating between the rear-illuminated display and an intended viewing area that selectively absorbs an incident optical energy in a plurality of absorption wavelength regions and selectively transmits at least 50% of the incident optical energy in a plurality of transmission wavelength regions, the transmission regions distinct from the absorption regions.

26. An optical device in accordance with claim 25, wherein the absorption regions correspond to yellow and cyan light.

27. An optical device in accordance with claim 26, wherein the transmission regions correspond to blue, green, and red light.

28. An optical device in accordance with claim 25, wherein the transmission regions correspond to blue, green, and red light.

* * * * *